United States Patent [19]

Ellis et al.

[11] Patent Number: 4,543,511
[45] Date of Patent: Sep. 24, 1985

[54] SEMICONDUCTOR ELECTRODES HAVING REGIONS OF GRADED COMPOSITION EXHIBITING PHOTOLUMINESCENCE AND ELECTROLUMINESCENCE

[75] Inventors: Arthur B. Ellis, Madison, Wis.; Holger H. Streckert, San Diego, Calif.

[73] Assignee: Wisconsin Alumni Research Foundation, Madison, Wis.

[21] Appl. No.: 478,476

[22] Filed: Mar. 24, 1983

[51] Int. Cl.$^4$ .................. H05B 33/14; H01L 33/00
[52] U.S. Cl. ........................ 315/169.3; 315/150; 313/505; 313/507; 313/358; 357/90; 357/61; 429/111
[58] Field of Search ............... 315/169.3, 150; 313/507, 512, 505, 501, 503, 358; 357/30, 61, 90; 250/552; 429/111; 428/917

[56] References Cited

U.S. PATENT DOCUMENTS

| | | | |
|---|---|---|---|
| 2,918,594 | 12/1959 | Fridrich | 313/358 X |
| 3,600,172 | 8/1971 | Land | 313/507 X |
| 3,961,253 | 6/1976 | Brych | 313/358 X |
| 4,064,326 | 12/1977 | Manassen et al. | 429/111 |
| 4,117,504 | 9/1978 | Maslov et al. | 357/61 X |
| 4,148,045 | 4/1979 | Fang et al. | 357/90 X |
| 4,199,385 | 4/1980 | Hung et al. | 357/90 X |
| 4,227,948 | 10/1980 | Jensen et al. | 357/61 X |
| 4,301,463 | 11/1981 | Burrus, Jr. et al. | 357/61 X |
| 4,319,259 | 3/1982 | Ohsima et al. | 357/61 X |
| 4,368,216 | 1/1983 | Manassen et al. | 429/111 X |

OTHER PUBLICATIONS

Matsunaga et al., "$Zn_{1-x}Cd_xTe$ pn Junctions Prepared by Liquid Phase Epitaxy", Elec. Eng'r'g. in Japan, vol. 95, No. 5, 1975, pp. 15–19.

Streckert, H. H.; Tong, J.; Ellis, A. B., *Luminescent Photoelectrochemical Cells*, J. Am. Chem. Soc., vol. 104, No. 2, Jan. 1982, pp. 581–588.

*Primary Examiner*—David K. Moore
*Assistant Examiner*—Vincent DeLuca
*Attorney, Agent, or Firm*—Isaksen, Lathrop, Esch, Hart & Clark

[57] ABSTRACT

A photoelectrochemical cell (10) is disclosed which has a semiconductor substrate (11) formed of a solid solution of three metal and non-metal elements, with two like elements varying in concentration with depth from an exposed surface (13) of the substrate (11). The band gap energies between the valence and conduction bands varies with the concentration of the two elements from the surface, with the band gap energies being in a proper range to provide emitted light in response to light or electrical stimulation. An electrolyte (14) is maintained in contact with the exposed surface and a counterelectrode (15) is immersed in the electrolyte such that a voltage applied between a counterelectrode (15) and the substrate (11) will vary the color of light emitted from the exposed surface (13) in response to incident light or by stimulation from the electrical current passing through the substrate. Preferred materials for the substrate are cadmium and selenium, with sulfur being diffused into the exposed surface and substituted in the lattice for selenium.

23 Claims, 4 Drawing Figures

SEMICONDUCTOR ELECTRODES HAVING REGIONS OF GRADED COMPOSITION EXHIBITING PHOTOLUMINESCENCE AND ELECTROLUMINESCENCE

This invention was made with U.S. Government support under Grant No. N00014-78-C-0633 awarded by the Department of the Navy. The Government has certain rights in this invention.

TECHNICAL FIELD

This invention pertains generally to semiconductor materials which exhibit photoluminescence and electroluminescence and to the methods of manufacture and use of devices incorporating such materials.

BACKGROUND ART

Various semiconductor materials are used as electrode elements in photoelectrochemical cells (PECs). The impingement of light radiation on the surface of such cells results in electron-hole pair generation, which can be manifested in a photogenerated current when the semiconductor material is properly connected in an electrical circuit. Converse processes can occur in which an electrical current passed through the material will result in the emission of visible or near visible radiation from the material. The emitted light generally has a spectral density which is characteristic of the material. Some of these materials display photoluminescence, in that light is emitted from the material at its characteristic spectrum upon excitation by external light impinging on its surface.

Interfacial charge-transfer processes at semiconductor electrodes have been actively investigated, and among the most widely studied semiconductor electrodes is n-type cadmium selenide (CdSe). The popularity of CdSe derives in part from its relatively small band gap, in the range of 1.7 eV, and the ease with which single-crystal, polycrystalline, and thin film samples can be fashioned into electrodes for PEC usage. Photoluminescence can be perturbed and electroluminescence initiated in single-crystal, n-type CdSe electrodes by interfacial charge-transfer processes. Investigations of photoluminescence and electroluminescence in CdSe indicate that photoluminescence and electroluminescence occur from a common excited state but under some conditions may originate at different depths from the surface of the semiconductor material.

Such substrates can be employed as the active electrode in a photoelectrochemical cell. It has been found that the application of a voltage between the CdSe electrode and a counterelectrode immersed in the electrolyte of the PEC will result in a quenching of the magnitude of photoluminescence from the active electrode at certain applied voltages. The intensity of light emitted by electroluminescence is also found to vary with the applied voltage where a suitable electrolyte is used to facilitate emission. See: Streckert, H. H.; Tong, J.; Ellis, A. B., *Luminescent Photoelectrochemical Cells*, J. Am. Chem. Soc., Vol. 104 No. 2, 1982, pp. 581–588. With such electrode material, it is found that only the emission intensity and not its spectral distribution is significantly affected by the potentials utilized.

SUMMARY OF THE INVENTION

In accordance with the present invention, a semiconductor substrate is formed which has a base semiconductor lattice composed of a solid solution of a metal and a non-metal, which together have a characteristic emission spectra, in which a third element, either a metal or non-metal, is substituted in a near-surface layer for the like element (metal or non-metal) in the substrate. The substituent and the constant component of the substrate, when in solid solution, have a characteristic emission spectrum which is centered at a substantially different wavelength than that of the unsubstituted base substrate. The degree of substitution varies with the distance from the surface into the material, preferably ranging from substantially complete substitution at the surface to a completely unsubstituted state a short distance into the material. It has been found that in such a structure the light emitted from the substituted surface region in response to electrical or light stimulation will have a color which is a function of the depth in the material at which emission occurs. When such an electrode is immersed in an electrolyte which is thereby maintained in contact with the substituted surface, the application of a potential between a counterelectrode and the emission electrode causes the depth within the material at which emission occurs to be controlled as a function of the potential across the electrode, thereby allowing the color of the light emitted from the electrode to be controlled as a function of applied voltage.

Substrates exhibiting variable color emission are characterized as solid solutions of three metal and non-metal elements in which the concentration of two of the elements in the solution, either both metals or both non-metals, is graded, that is, varies with depth from the surface such that the band gap energy between the valence and conduction bands changes with depth from the surface. It is also preferred that the band gap energies result in emission spectra in the visible light range.

The photoelectrode may be constructed by diffusing the substituent element into at least one surface of the substrate for a period of time and at a selected diffusion temperature such that the concentration of the substituent decreases monotonically from virtually complete substitution at the surface to an unsubstituted state a short distance into the substrate, preferably no more than two microns. A conducting lead is then mounted for electrical contact to the surface of the substrate opposite that into which the substituent has been diffused, the substrate is preferably encapsulated to leave only the substituted surface exposed, and the device is immersed in an appropriate electrolyte to form, with a counterelectrode (and reference electrode, where desired), a photoelectrochemical cell which, with a voltage source, allows an electrical potential to be applied between the substituted surface and the bulk of the substrate. The type of electrolyte utilized is chosen depending on whether the device is to be used for electroluminescence or for photoluminescence.

An electroluminescent device is obtained by utilizing an electrolyte, in contact with the substituted surface, which has an oxidation potential sufficiently high that it can remove an electron from the substituted surface and inject a hole therein with energy sufficient to result in visible light emission upon recombination of the hole with an electron within the substrate. A variable voltage power supply is connected between the emission electrode and a counterelectrode in the electrolyte, and the color of the light emitted from the electrode can be varied as a function of the applied voltage.

A photoluminescent device can be similarly formed utilizing an electrolyte which does not have a high oxidizing potential. Light radiation at an energy greater than the band gap energy incident on the substituted surface will result in emission of light from the electrode which is a mix of the characteristic emission spectra of the material in the substrate, depending on the depths at which the incident photons excite the material. Application of a voltage between the emissive electrode and a counterelectrode in the electrolyte quenches the emission of light from the emissive electrode, primarily from the near-surface regions, thereby varying the color of the light emitted in response to the incident stimulating light.

Any combination of three metal and non-metal elements which form solid solutions and satisfy the foregoing band gap energy requirements may be utilized in accordance with the present invention. A preferred example of such three elements are cadmium, selenium, and sulfur, particularly a cadmium selenide substrate with sulfur diffused into one surface.

Photoelectrodes in accordance with the present invention may be utilized in color displays for imaging wherein a change in color can be obtained by variation in the bias voltage. Electrodes having graded composition at their surfaces may also be used in photovoltaic cells to provide a different sensitivity to incident light of various wavelengths than could be obtained with homogeneous electrodes.

Further objects, features and advantages will be apparent from the following detailed description taken in conjunction with the accompanying drawings.

BEST MODE FOR CARRYING OUT THE INVENTION

Figure 1:
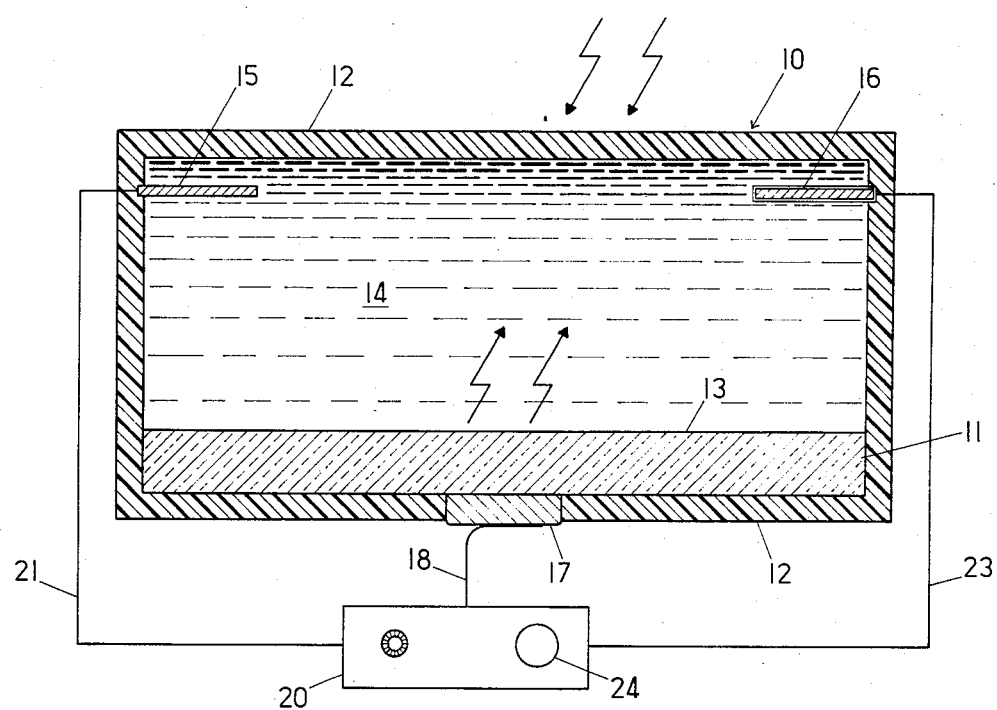
FIG. 1 is a cross-sectional view of a photoelectrochemical cell in accordance with the invention in an electrical circuit.

With reference to the drawings, a photoelectrochemical cell (PEC) device is shown generally at 10 in FIG. 1. The device has an emissive electrode 11 formed of a flat plate substrate of semiconductor material which is substantially encapsulated on three sides by a non-reactive insulating material 12, such as glass or various types of suitable plastics, leaving an exposed surface 13 which can absorb and emit light. The encapsulating material 12 may also extend upwardly beyond the electrode 11 to form an enclosure for the device, defining an internal cavity which is filled with an electrolyte 14. A counterelectrode 15, suitably formed of platinum, and a standard reference electrode (SCE) 16 are mounted to the encapsulating material 12 and immersed within the electrolyte 14.

The emissive electrode 11 is connected, as by a low ohmic metal contact 17 at its opposite side, to an electrical conducting line 18 which extends to a potentiostat 20, which may be of standard commercial construction. The counterelectrode 15 is connected through an electrical conductor 21 to another terminal of the potentiostat 20. An electrical conductor 23 connects the SCE reference electrode 16 to the potentiostat 20, which includes a voltmeter having a display 24 which shows the voltage between the emissive electrode 11 and the SCE electrode 16. The potentiostat 20 also provides a source of voltage between the counterelectrode 15 and the emissive electrode 11 which can be adjusted to provide a desired potential between the emissive electrode and the SCE reference electrode.

The material 12 forming the case for the device 10 is substantially transparent, allowing visible light to pass therethrough and impinge upon the exposed surface 13 of the electrode, and conversely, allowing light emitted from the surface 13 to pass through the case for observation. The electrolyte 14 is also preferably substantially transparent.

The semiconductor substrate forming the electrode 11 has a base semiconductor lattice composed of a solid solution of a metal and a non-metal which together have a characteristic emission spectrum, preferably in the visible range. A third material, a metal or non-metal, is substituted for the like element (metal or non-metal) in the substrate in a thin, graded layer. The material at the surface of the graded layer, a solid solution consisting mainly or exclusively of the constant element and the substituent, has a characteristic emission spectrum centered at a substantially different wavelength than that at which the spectrum of the unsubstituted base substrate is centered. The concentration of substituent decreases and the concentration of the displaced element increases with increasing depth from the surface. In such a structure, the light emitted from the exposed surface in response to electrical or light stimulation will have a color which is a function of the depth in the material at which the electron-hole recombination responsible for the emission occurs. By immersing such an electrode in an electrolyte in contact with the substituted surface, a potential can be applied between a counterelectrode and the emissive electrode, and thereby between the substituted surface and the base lattice of the substrate, to control the depth at which recombination emission occurs, thereby controlling the color of the light emitted.

The semiconductor substrates which exhibit variable color emission in accordance with the present invention are characterized as solid-state solutions of three elements, including at least one metal and at least one non-metal element: these elements function in the electrode substrate as a constant element, a substituent element, and a displaced element. The concentration of the substituent and the displaced elements, both of which are either metals or non-metals, is varied, preferably monotonically, with depth such that the band gap energy between the valence and conduction bands changes with depth. For emissions in the visible spectrum, assuming band edge emission, the band gap would preferably vary between about 1.7 eV and 3 eV.

Any combination of three metal and non-metal elements that form solid solutions together which satisfies the foregoing band gap energy requirements may be utilized in accordance with the present invention. Examples of such trios of elements are: cadmium, selenium, and sulfur; zinc, selenium, and sulfur; cadmium, zinc, and sulfur; and cadmium, selenium, and zinc. To the extent that such elements satisfy the foregoing requirements of forming solid solutions at all levels of substitution and having appropriate band gap energies, any one of the trio of elements may serve as the constant element, the displaced element, or the substituent.

For utilization as a photoluminescent cell, the electrolyte 14 is selected to provide satisfactory conduction characteristics between the exposed surface 13 of the electrode and the counterelectrode 15 and a satisfactory redox potential with respect to the semiconductor material forming the electrode 11. For utilization as an electroluminescent cell, the electrolyte 14 should also have sufficient oxidizing potential with respect to the material of the electrode 11 to provide hole injection from the exposed surface 13 into the bulk of the electrode material. Alternatively, a substantially transparent solid electrode may be formed on the substituted surface of the substrate, e.g., by vapor depositing of metal, to serve the function of the counterelectrode and electrolyte.

As a specific illustrative example of a PEC device formed in accordance with the invention, graded cadmium sulfide/cadmium selenide ($CdS_xSe_{1-x}$, $0 \leq X \leq 1$) samples were prepared from 5 by 5 by 1 millimeter, vapor-grown, single-crystal C plates of n-type cadmium selenide (resistivity approximately 2 ohm-cm; 4-point probe method). In a typical procedure, a CdSe plate was etched with $Br_2$ in methanol (1:10 V/V) and placed in a 6-millimeter inside diameter, 8-millimeter outside diameter quartz tube with approximately 0.6 milligrams of sulfur, which was free of metallic impurities to better than 10 parts per million (ppm). The quartz ampoule was evacuated (approximately 1 torr), sealed to a volume of about 2 cubic centimeters, and placed in a preheated Lindberg furnace (700° C.) for 15 minutes. After the ampoule was removed from the furnace, one end was contacted by a heat sink to prevent the sulfur from condensing on the crystal substrate. The crystal substrate was then removed and placed in a similar tube with approximately 1 milligram of cadmium having less than 1 ppm of metallic impurities. The tube was evacuated and sealed and again heated at 700° for 15 minutes. After its removal from the ampoule, one surface of the substrate was etched to remove the layer of material into which the cadmium and sulfur were diffused, a gallium-indium ohmic contact was formed on the etched surface and a copper wire was attached to the contact with silver epoxy. The substrate was then encapsulated in epoxy, leaving sulfur substituted surface exposed, and ready for mounting in a photoelectrochemical cell containing an electrolyte, a platinum counterelectrode, and an SCE reference electrode.

Figure 2:
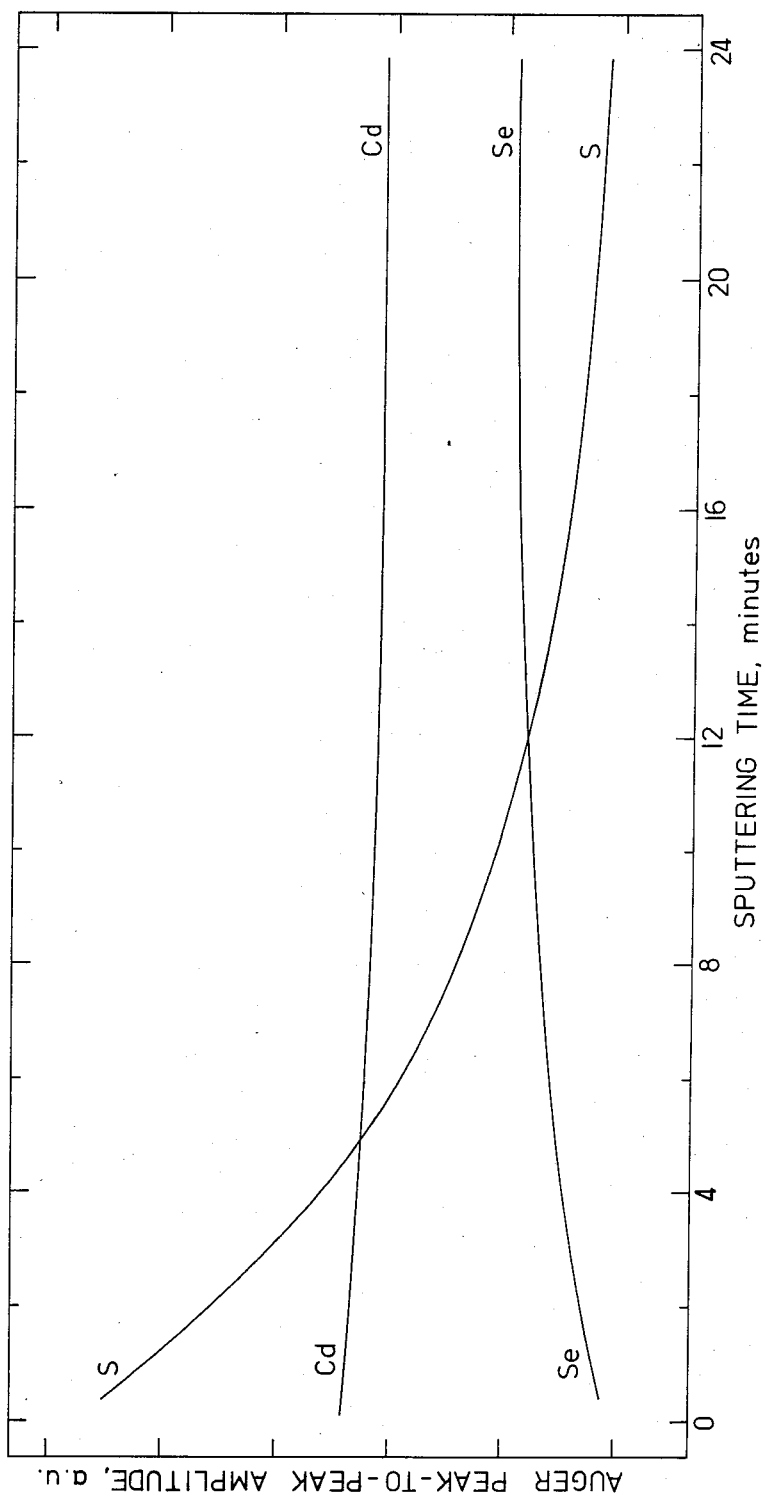
FIG. 2 is an Auger-depth profile analysis of a graded cadmium sulfide/cadmium selenide electrode.

Auger electron spectroscopy (AES) was used in conjunction with argon ion sputter etching to determine a depth profile of the composition of the electrode. Sputter etching was conducted at a rate of approximately 300 angstroms per minute while monitoring the AES signals of cadmium, sulfur and selenium. The data obtained from these tests are shown in FIG. 2. As illustrated in FIG. 2, the exposed surface into which sulfur and cadmium have been diffused contains mainly cadmium and sulfur with a small quantity of selenium also present. A monotonic decline in sulfur and an increase in selenium occur over a region of approximately one micron from the surface (about 30 minutes of sputtering) at which point the graded region gives way to the cadmium selenide substrate. A similar depth profile was found using heat treatment diffusion periods of one hour with the depth of the graded region being increased by a factor of about two. The AES data supports the conclusion that sulfur is predominently substituting for selenium in the lattice rather than entering it interstitially. It is noted that at any of the sputter times of FIG. 2, the fractional sulfur and selenium compositions total to roughly unity when each is expressed as a fraction of its maximum AES signal. Since sulfur could be driven toward the bulk of the material by the sputtering process, the distances drawn from FIG. 2 may be best regarded as upper limits. That these distances are roughly correct was confirmed by exposing different strata in the graded region by chemically etching a portion of the substrate, observing the photoluminescence at each stratum to determine the composition of the surface exposed, and measuring the distance between the exposed surface and the unetched surface of the substrate with a contacting stylus. Such a graded layer in the substrate could also be formed by ion implantation and annealing. It is also noted that low levels of impurities or dopants may be present in the substrate which could affect the emission process.

Figure 3:
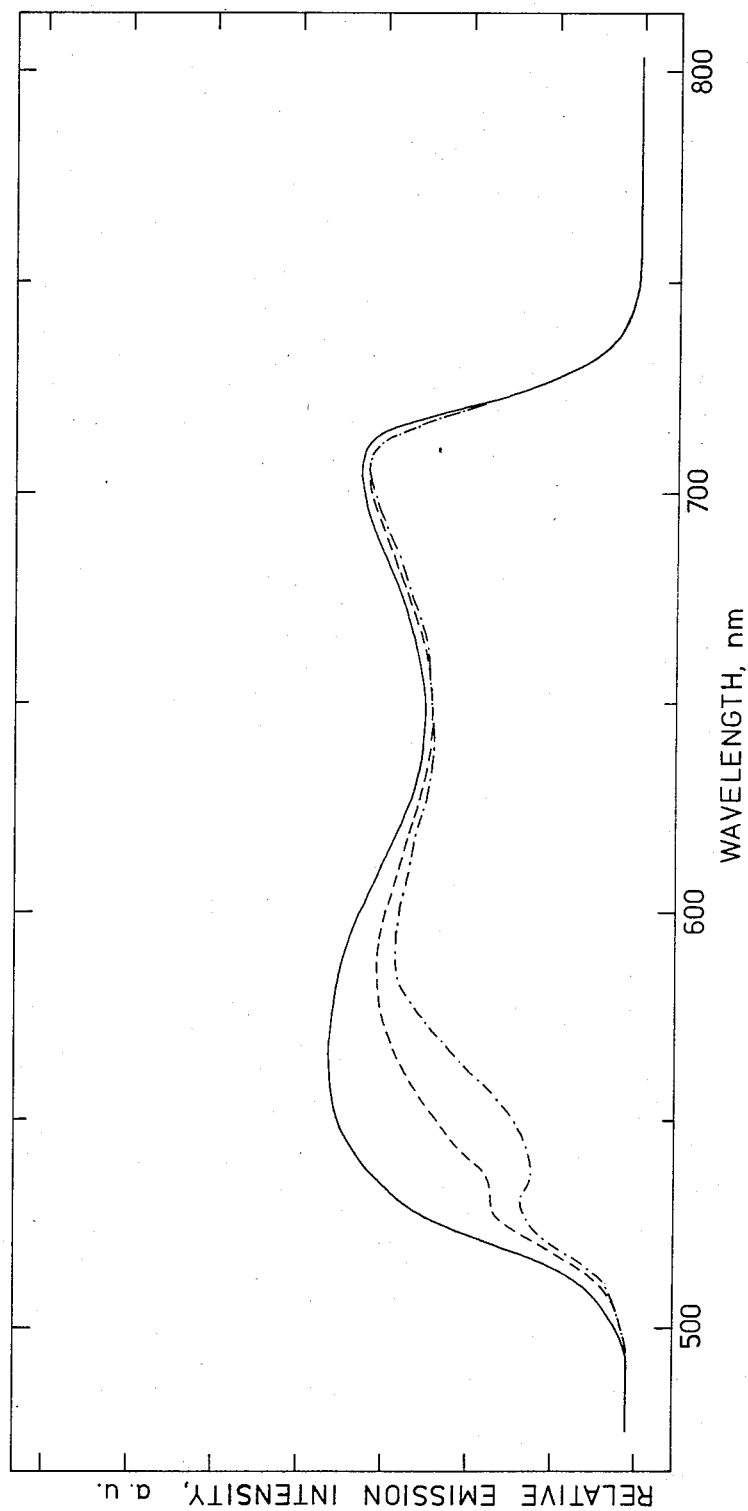
FIG. 3 illustrates the photoluminescent spectra of a graded cadmium sulfide/cadmium selenide electrode as a function of applied voltage having the profile of FIG. 2.

The emissive electrode with a graded, substituted surface layer prepared as described above was incorporated in a PEC cell with a platinum counterelectrode and a SCE reference electrode and connected to a potentiostat having a source of variable voltage potential. Aqueous alkaline polysulfide (1 M $OH^-$/1 M $S^{2-}$/0.1 M S) or aqueous alkaline sulfide (1 M $OH^-$/1 M $S^{2-}$) solutions were used as electrolytes in the cell. The emissive electrode had an exposed surface area of approximately 0.15 square centimeter. To facilitate analysis of the emission spectra, the cell was constructed in the sample compartment of an emission spectrometer. Front surface photoluminescence spectra were obtained by positioning the sample at about 45° to an argon ion laser beam and to the emission detection optics of the spectrometer. The curves of FIG. 3 show the relative emission intensity obtained at various electrode potentials vs SCE. The electrolyte used was 1 M $OH^-$/1 M $S^{2-}$ and was purged by bubbling $N_2$ through it. The argon ion laser beam used for excitation uniformly irradiated the entire 0.15-cm² sample surface area with 457.9-nm excitation at about 1.6 mW of power. A sweep rate of 10 mV/sec. was used and the electrolyte redox potential was −0.71 V vs SCE. The three curves in FIG. 3 show uncorrected photoluminescence spectra obtained at open circuit (————), −1.0 V (— — — — — — —), and −0.3 V vs SCE (— — — —). Similar data were also obtained using aqueous alkaline polysulfide solution electrolyte (1 M $OH^-$/1 M $S^{2-}$/0.1 M S).

It is seen from FIG. 3 that, in sharp distinction to homogeneous cadmium sulfide/cadmium selenide electrodes, the photoluminescent spectral distribution of the inhomogeneous sample is potential dependent. The passage of photocurrent preferentially quenches the high energy portion of the photoluminescence spectrum which corresponds to sulfur-rich, near-surface regions. The extent of quenching at some wavelengths reaches about 70% between open circuit and −0.3 V vs SCE. By comparison, the photoluminescence intensity from the more remote, selenium-rich regions suffers far less quenching, typically less than 5% between open circuit and −0.3 V vs SCE.

An electroluminescent device was prepared in a manner identical to that above with the exception that an aqueous, alkaline solution containing peroxydisulfate (5 M NaOH/0.1 M $K_2S_2O_8$), a strong oxidizing agent, was utilized as the electrolyte. It is proposed that the peroxydisulfate ion is reduced by an electron in or near the conduction band to produce a sulfate radical which is sufficiently oxidizing to inject a hole into the valence band. The radiative recombination of the injected hole with an electron leads to the observed luminescence. Similar strong oxidizing agents, such as hydrogen peroxide, may also be used under appropriate conditions.

Figure 4:
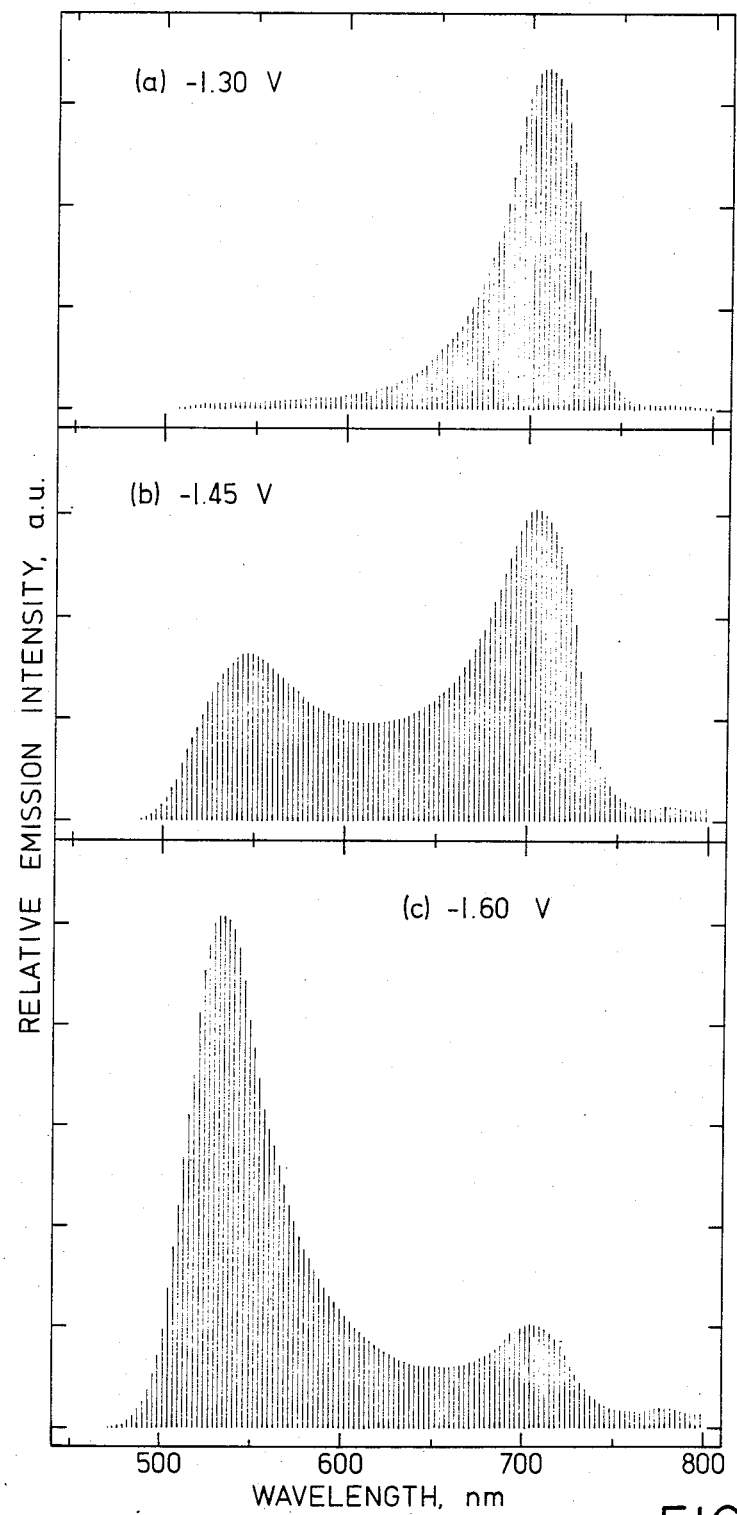
FIG. 4 shows the uncorrected electroluminescent spectra as a function of applied voltage of a graded cadmium sulfide/cadmium selenide electrode having the profile of FIG. 2.

The device was placed in the spectrometer and a potential was applied to the emissive electrode by repetitively pulsing the electrode between 0.0 V vs SCE for 11 seconds and a selected cathodic potential for 1 second. Slowly scanning the emission monochromator at 12 nm/min then produced a series of lines constituting the electroluminescence spectra, which are illustrated in FIG. 4. The particular spectra of FIG. 4 were obtained by pulsing at selected cathodic potentials of $-1.30$ V, FIG. 4(a), $-1.45$ V, FIG. 4(b), and $-1.60$ V, FIG. 4(c). All spectra were taken in an identical sample geometry; however, the $-1.45$ V spectrum was taken at twice the sensivity used to obtain the $-1.30$ and $-1.60$ V spectra. FIG. 4 demonstrates that electroluminescence from this electrode has a potential-dependent spectral distribution. As the potential used to initiate electroluminescence is varied from $-1.3$ to $-1.6$ V vs SCE, the emission blue-shifts from the red to the green portion of the spectrum.

The color changes observed from FIG. 4 lead to the conclusion that, as the initiation potential becomes more cathodic, electroluminescence originates, on average, nearer the semiconductor-electrolyte interface. A possible explanation for this may involve the concentration of conduction band electrons near the surface available for recombination. At the more anodic potentials, a lower concentration of (near—) surface electrons is expected, permitting an injected hole to diffuse relatively deeply into the substrate before recombination occurs; this would lead to the domination of the electroluminescence spectrum by contributions from more remote, selenium-rich compositions. At the more cathodic potentials, a greater concentration of (near—) surface electrons would enhance the likelihood of recombination in the sulfur-rich region of the electrode.

It is understood that the invention is not confined to the particular constructions, compositions, or examples set forth herein, but embraces such modifications thereof as come within the scope of the following claims.

What is claimed is:

1. A photoemissive device, comprising:
   (a) an emissive electrode including a substrate having a base lattice formed of a solid solution of a metal element and a non-metal element which together have a characteristic emission spectrum, a substituent element substituted in a surface layer of the substrate for the element of like metal or non-metal character, the substituent and the element of opposite metal or non-metal character together having a characteristic emissive spectrum centered at a wavelength substantially different from that at which the emission spectrum of the unsubstituted base lattice is centered, the degree of substitution of the substituent decreasing with depth from the surface; and
   (b) means for applying an electrical potential between the substituted surface of the emissive electrode substrate and the base lattice of the electrode substrate such that variation of the applied potential will change the emission spectrum of the emitted radiation.

2. The device of claim 1 wherein the means for applying electrical potential includes:
   (a) an electrolyte in contact with the substituted surface;
   (b) a counterelectrode immersed in the electrolyte; and
   (c) an electrical conducting line connected in electrical contact with the base lattice of the substrate.

3. The device of claim 1 wherein the elements forming the base substrate and the substituent are selected from the group of trios of elements consisting of: cadmium, selenium and sulfur; zinc, selenium and sulfur; cadmium zinc and sulfur; and cadmium, selenium and zinc.

4. The device of claim 2 wherein the base substrate is a solid solution of cadmium and selenium and the substituent is sulfur.

5. The device of claim 4 wherein the electrolyte is selected from the group consisting of solutions of aqueous alkaline sulfide, aqueous alkaline polysulfide, and aqueous alkaline peroxydisulfate.

6. The device of claim 5 wherein the sulfur substituent decreases monotonically in concentration from essentially complete substitution for selenium at the surface to substantially no substitution at a depth no greater than about two microns from the surface.

7. The device of claim 6 further including an SCE reference electrode immersed in the electrolyte and means for measuring the voltage between the SCE reference electrode and the emission electrode.

8. The device of claim 1 wherein the characteristic emission spectra of the metal and non-metal elements are in the visible range.

9. A photoemissive device comprising:
   (a) an emissive electrode including a substrate formed of a solid solution of three metal and non-metal elements in which the concentration of two like elements varies with depth from an exposed surface of the substrate such that the band gap energies between the valence and conduction bands changes with depth from the exposed surface, and wherein the band gap energies are such that the material of the substrate, to a selected depth beneath the exposed surface, provides emission spectra in response to electrical or light stimulation; and
   (b) means for applying an electrical potential between the exposed surface of the substrate and the bulk of the substrate beneath the exposed surface such that variation of the applied potential will change the emission spectrum of the emitted radiation.

10. The device of claim 9 wherein the means for applying electrical potential includes:
    (a) an electrolyte in contact with the exposed surface;
    (b) a counterelectrode immersed in the electrolyte; and
    (c) an electrical conducting line connected in electrical contact with the bulk of the substrate beneath the exposed surface.

11. The device of claim 9 wherein the three metal and non-metal elements forming the substrate are selected from the group of trios of elements consisting of: cadmium, selenium and sulfur; zinc, selenium and sulfur; cadmium, zinc and sulfur; and cadmium, selenium and zinc.

12. The device of claim 10 wherein the substrate is formed of cadmium, selenium and sulfur and wherein the concentration of selenium and sulfur varies from the exposed surface such that the concentration of sulfur decreases monotonically with depth from the surface and the concentration of selenium increases with depth from the surface.

13. The device of claim 12 wherein the electrolyte is selected from the group consisting of solutions of aqueous alkaline sulfide, aqueous alkaline polysulfide, and aqueous alkaline peroxydisulfate.

14. The device of claim 13 wherein the sulfur decreases monotonically in concentration from essentially complete substitution for selenium at the exposed surface to substantially no substitution at a depth no greater than about two microns from the surface.

15. The device of claim 14 further including an SCE reference electrode immersed in the electrolyte and means for measuring the voltage between the SCE reference electrode and the emissive electrode.

16. The device of claim 9 wherein the characteristic emission spectra of the metal and non-metal elements are in the visible range.

17. A method of forming a photoelectrochemical cell, comprising the steps of:
  (a) providing a base substrate comprising a solid solution of metal and a non-metal having a characteristic emission spectrum;
  (b) diffusing a substituent element into a surface of the base substrate for a period of time and at a temperature selected such that the concentration of the substituent in the substrate declines from a level of substantially complete substitution for the like metal or non-metal element at the surface to substantially no substitution at a selected distance into the substrate to form an emissive electrode;
  (c) mounting an electrical conductor into ohmic electrical contact with the surface of the emissive electrode substrate opposite that into which the substituent has been diffused; and
  (d) immersing the emissive electrode in an electrolyte.

18. The method of claim 17 wherein the base substrate comprises a solid solution of cadmium and selenium, the substituent is sulfur, and the electrolyte is selected from the group consisting of solutions of aqueous alkaline sulfide and aqueous alkaline polysulfide.

19. The method of claim 17 wherein the base substrate comprises a solid solution of cadmium and selenium, the substituent is sulfur, and the electrolyte is aqueous alkaline peroxydisulfate solution.

20. A method of providing emitted light of varying color in response to incident light, comprising the steps of:
  (a) providing an emissive electrode having a substrate formed of a solid solution of three metal and non-metal elements in which the concentration of two like elements varies with depth from an exposed surface of the substrate such that the band gap energies between the valence and conduction bands changes with depth from the exposed surface, and wherein the band gap energies are such that the material of the substrate, to a selected depth beneath the exposed surface, provides emission spectra in the visible range in response to light stimulation;
  (b) maintaining an electrolyte in contact with the exposed surface of the emissive electrode;
  (c) applying light to the exposed surface at an intensity sufficient to cause photoluminescence from the exposed surface; and
  (d) applying a voltage of varying magnitude between the electrolyte and the emissive electrode substrate to produce emissions from the exposed surface of varying color.

21. The method of claim 20 wherein the substrate is formed of a solid solution of cadmium, selenium and sulfur and in which the concentration of selenium and sulfur varies with depth such that the concentration of sulfur decreases monotonically with depth from the surface and the concentration of selenium increases with depth from the surface, and wherein the electrolyte is selected from the group consisting of solutions of aqueous alkaline sulfide and aqueous alkaline polysulfide.

22. A method of providing varying colors in response to an electrical signal comprising the steps of:
  (a) providing an emissive electrode having a substrate formed of a solid solution of three metal and non-metal elements in which the concentration of two like elements varies with depth from an exposed surface of the substrate such that the band gap energies between the valence and conduction bands changes with depth from the exposed surface, and wherein the band gap energies are such that the material of the substrate, to a selected depth beneath the exposed surface, provides emission spectra in the visible range in response to electrical stimulation;
  (b) maintaining an oxidizing electrolyte in contact with the exposed surface of the substrate;
  (c) applying a voltage of varying magnitude between the electrolyte and the emissive electrode substrate to produce electroluminescence from the exposed surface of a color varying with the magnitude of the applied voltage.

23. The method of claim 22 wherein the substrate is formed of a solid solution of cadmium, selenium and sulfur and in which the concentration of selenium and sulfur varies with depth such that the concentration of sulfur decreases with depth from the surface and the concentration of selenium increases with depth from the surface, and wherein the electrolyte is an aqueous alkaline peroxydisulfate solution.

* * * * *